(12) United States Patent
Murgatroyd et al.

(10) Patent No.: US 6,917,735 B2
(45) Date of Patent: Jul. 12, 2005

(54) APPARATUS FOR INTERROGATING AN OPTICAL SIGNAL

(75) Inventors: Ian John Murgatroyd, Birmingham (GB); Catherine Anne Sugden, Birmingham (GB); Karen Elizabeth Chisholm, Birmingham (GB)

(73) Assignee: Aston University, Birmingham (GB)

( * ) Notice: Subject to any disclaimer, the term of this patent is extended or adjusted under 35 U.S.C. 154(b) by 160 days.

(21) Appl. No.: 10/297,166

(22) PCT Filed: May 31, 2001

(86) PCT No.: PCT/GB01/02422

§ 371 (c)(1),
(2), (4) Date: Dec. 2, 2002

(87) PCT Pub. No.: WO01/94896

PCT Pub. Date: Dec. 13, 2001

(65) Prior Publication Data

US 2003/0142977 A1 Jul. 31, 2003

(30) Foreign Application Priority Data

Jun. 2, 2000 (GB) .............................. 0013411

(51) Int. Cl.[7] .............................................. H04B 10/12
(52) U.S. Cl. .............................. 385/37; 385/27; 398/25
(58) Field of Search ................................ 385/24–27, 37

(56) References Cited

U.S. PATENT DOCUMENTS 5,633,748 A    5/1997   Perez et al. ................. 359/325
5,850,302 A  * 12/1998  Strasser et al. ............... 398/93
5,864,641 A  *  1/1999  Murphy et al. ............... 385/12
5,892,582 A     4/1999  Bao et al. .................... 356/519
5,974,212 A    10/1999  Saekj .......................... 385/37

FOREIGN PATENT DOCUMENTS

EP    0 495 413 A1    7/1992    ............. 385/147 X
EP    1 130 712 A2    9/2001    ............. 385/147 X

* cited by examiner

Primary Examiner—Brian Healy
Assistant Examiner—Eric Wong
(74) Attorney, Agent, or Firm—Beyer Weaver & Thomas, LLP

(57) ABSTRACT

Apparatus (10) for interrogating an optical signal (not shown) propagating in an optical waveguide, such as an optical fiber, having an input section (12) and a second section (14) through which light entering from the input section (12) will subsequently propagate. The second section (14) includes a grating portion, such as a tilted chirped fiber Bragg grating (16). The grating (16) causes at least part of the optical signal to be coupled out of the optical fiber, through the fiber cladding. A photodetector (18) is provided generally alongside the grating (16). The photodetector (18) is arranged to collect and detect substantially all of the outcoupled optical signal. The relationship between the optical power outcoupled by the grating (16) and the wavelength of the optical signal is known, allowing a measurement of the outcoupled optical power to be used to determine the wavelength of the optical signal propagating through the grating (16).

73 Claims, 7 Drawing Sheets

APPARATUS FOR INTERROGATING AN OPTICAL SIGNAL

The present invention relates to apparatus for interrogating an optical signal propagating in an optical fibre.

It is often desirable to be able to interrogate an optical signal propagating within an optical fibre, to measure the power, at a certain wavelength or within a certain wavelength range, or to determine the wavelength of the optical signal. These measurements are generally made by coupling at least part of the optical signal out of the fibre and using a bulk optic measuring device to interrogate the signal. For example, the power at a particular wavelength may be measured using an optical spectrum analyser, and the wavelength of an optical signal can be determined using an optical spectrum analyser or a wavelength meter. However, bulk optic devices such as these are generally large and expensive, and they are not compatible with an optical fibre based system. In addition, bulk optic devices are sensitive to misalignment, which generally makes them unsuitable for use in the field.

According to the present invention, in a first aspect, there is provided apparatus for interrogating an optical signal propagating in an optical waveguide, the apparatus comprising an optical waveguide having a grating portion along which the refractive index of the waveguide varies periodically, the said variation giving the grating portion a spectral profile having a first region across which the transmitted optical power is substantially constant as a function of wavelength and a second region across which the transmitted optical power changes as a function of wavelength, the said variation of refractive index causing at least part of the optical signal to be coupled out of the grating portion of the waveguide, and first optical means operable to measure the optical power of an outcoupled optical signal.

The optical waveguide is preferably an optical fibre.

Each of the first and second wavelength ranges are preferably broader than the spectral bandwidth of the optical signal to be interrogated. Desirably, the first wavelength range covers shorter wavelengths than the second wavelength range. The first and second wavelength ranges are preferably substantially adjacent in wavelength space.

The grating portion is preferably a tilted fibre Bragg grating, and is most preferably a tilted chirped fibre Bragg grating. The grating portion may alternatively be a tilted uniform period fibre Bragg grating.

The optical waveguide may alternatively comprise a planar optical waveguide.

The first optical means desirably comprises photodetector means. The photosensitive area of the photodetector means is preferably at least as great as the area covered by the outcoupled light. Alternatively, the first optical means may further comprise coupling means such as focusing optics provided within the path of the outcoupled light, to couple substantially all of the outcoupled light to the photodetector means.

In a second aspect the present invention further provides apparatus for determining the wavelength of an optical signal propagating in an optical waveguide, the apparatus comprising apparatus for interrogating an optical signal propagating in an optical waveguide, the apparatus being according to the first aspect of the invention, and utilising the second region of the spectral profile of the grating portion, and means for determining the total power of the optical signal to be interrogated, the wavelength of the said optical signal being proportional to the ratio of the power of the outcoupled optical signal to the total power of the optical signal.

The optical waveguide is preferably an optical fibre.

The grating portion preferably comprises a tilted fibre Bragg grating. The grating portion is preferably a tilted chirped fibre Bragg grating, or may alternatively be tilted uniform period fibre Bragg grating.

The apparatus may be particularly suitable for use in determining the wavelength of an optical signal which originates from a fibre coupled laser, such as a distributed feedback (DFB) laser provided within a pigtailed package.

The means for determining the total power of optical signal preferably comprises optical detection means. The optical detection means preferably comprises a photodetector means. The photodetector means is desirably located close to the back face of the DFB laser such that the whole of the laser beam emitted from the back face of the DFB laser is incident on the photosensitive area of the photodetector means, to thereby determine the total power of the optical signal.

The apparatus may alternatively or additionally be for use in determining the wavelength of an optical signal which originates from a fibre optic system, such as a fibre Bragg grating sensor system.

The means for determining the total power of the optical signal may comprise sampling means for tapping at least a known fraction of the optical signal out of the input section of fibre and directing the said signal fraction to an optical detection means. The optical detection means is desirably a photodetector means.

The sampling means is preferably a tap coupler. The sampling means may alternatively comprise apparatus according to the first aspect of the invention, utilising the first region of the spectral profile of the grating portion. The grating portion is desirably a tilted fibre Bragg grating. The grating portion is preferably a tilted chirped fibre Bragg grating, or may alternatively be a tilted uniform period fibre Bragg grating.

The means for determining the total power of the optical signal is preferably encountered by the optical signal before the apparatus for interrogating the optical signal.

The means for determining the total power of the optical signal may alternatively be encountered by the optical signal after the apparatus for interrogating the optical signal.

A plurality of apparatus for determining the wavelength of an optical signal propagating in an optical fibre may be provided along a length of optical fibre. Desirably, each of the said apparatus is operable to determine the wavelength of an optical signal within a particular range of wavelengths, each wavelength range being different. The apparatus are desirably arranged to be encountered by the or each optical signal, in series in order of increasing wavelength, the apparatus covering the shortest wavelengths being provided first in the series. The sampling means of each apparatus preferably taps substantially the whole of the optical signal within the respective wavelength range out of the fibre.

Preferably, each optical signal originates from a respective fibre Bragg grating sensor within a sensor system.

The optical waveguide may alternatively comprise a planar optical waveguide.

In a third aspect, the invention provides apparatus for stabilising the wavelength of a laser beam emitted by an optical waveguide coupled laser, the apparatus comprising an optical waveguide coupled bandpass filter, apparatus for interrogating an optical signal propagating through the filter, the apparatus being in accordance with the first aspect of the invention and the apparatus utilising the first region of the spectral profile of the grating portion, there being feedback tuning means operable to maintain the output wavelength of the laser at the peak wavelength of the passband of the bandpass filter.

The optical waveguide is preferably an optical fibre.

The grating portion is preferably a tilted chirped fibre Bragg grating. The grating portion is preferably a tilted chirped fibre Bragg grating, or may alternatively be a tilted uniform period fibre Bragg grating.

The optical waveguide coupled laser is desirably a semiconductor laser provided within a pigtailed package. The laser is desirably a pigtailed DFB laser. The wavelength and power of the DFB laser output signal is preferably controllable by a controller means.

The optical waveguide coupled bandpass filter is desirably an in-fibre bandpass filter. The in-fibre bandpass filter is preferably an in-fibre moiré grating, and is most preferably an in-fibre chirped moiré grating.

The feedback tuning means desirably comprises a feedback loop responsive to the output signal from the photodetector means to control the DFB laser. The feedback tuning means is preferably operable to tune the laser output signal wavelength to the peak wavelength of the passband of the bandpass filter.

The optical waveguide may alternatively comprise a planar optical waveguide.

In a fourth aspect, the invention provides apparatus for determining the value of a first parameter sensed by an in-fibre sensor, by interrogating an optical signal returned by the sensor, the apparatus comprising an optical waveguide coupled bandpass filter, tuning means operable to apply a variable second parameter to the bandpass filter, to thereby tune the peak wavelength of the passband of the bandpass filter to match the wavelength of the optical signal, and apparatus for interrogating an optical signal transmitted by the filter, the apparatus being in accordance with the first aspect of the invention and utilising the first region of the spectral profile of the grating portion, the apparatus being operable to measure the power of the optical signal transmitted by the bandpass filter, whereby to detect a wavelength match between the optical signal wavelength and the peak wavelength of the passband, to allow the value of the first parameter to be determined by calculation from the value of the second parameter applied to the bandpass filter.

The optical waveguide is preferably an optical fibre.

The grating portion is preferably a tilted fibre Bragg grating. The grating portion is preferably a tilted chirped fibre Bragg grating, or may alternatively be a tilted uniform period fibre Bragg grating.

The waveguide coupled bandpass filter is desirably an in-fibre bandpass filter. The in-fibre bandpass filter is preferably an in-fibre moiré grating, and is most preferably an in-fibre chirped moiré grating.

The tuning means is preferably operable to apply a variable axial force, and most preferably a variable axial strain, to the bandpass filter. The tuning means may alternatively be operable to apply a variable temperature to the bandpass filter.

The first parameter, applied to the Bragg grating sensor, is desirably axial strain, or may alternatively be temperature.

The apparatus may be particularly suitable for use in determining the value of a parameter applied to an in-fibre Bragg grating sensor. The apparatus may be particularly suitable for use in determing the value of a parameter applied to each of a plurality of in-fibre Bragg grating sensors.

The peak wavelength of each sensor Bragg grating may fall within the same wavelength range. The apparatus preferably further comprises time division multiplexing means operable to demultiplex the optical signals returned by the sensor Bragg gratings.

A plurality of apparatus may be provided along a length of optical fibre. Desirably, each of the said apparatus is operable to determine the value of a parameter applied to a corresponding one of a plurality of sensor fibre Bragg gratings, the peak wavelength of each sensor Bragg grating falling within a different wavelength range. The apparatus are desirably encountered by the or each optical signal in series, in order of increasing wavelength.

Specific embodiments of the invention will now be described in detail, by way of example only, with reference to the accompanying drawings, in which:

FIG. 8b shows an example optical spectrum, in transmission, of a chirped moiré grating, suitable for use in the apparatus of FIG. 8a;

Figure 1:
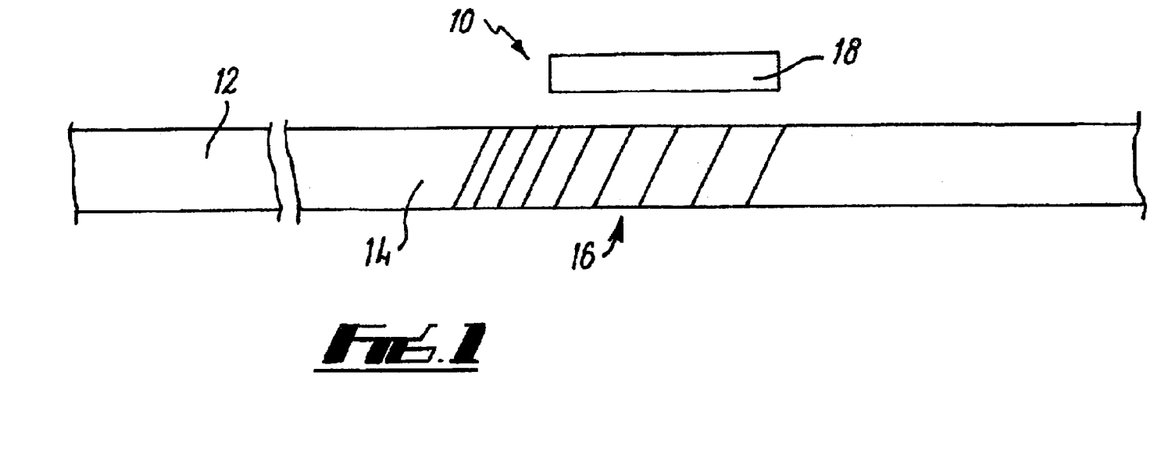
FIG. 1 is a schematic representation of apparatus for interrogating an optical signal propagating in an optical fibre, according to one aspect of the present invention.
Figure 2:
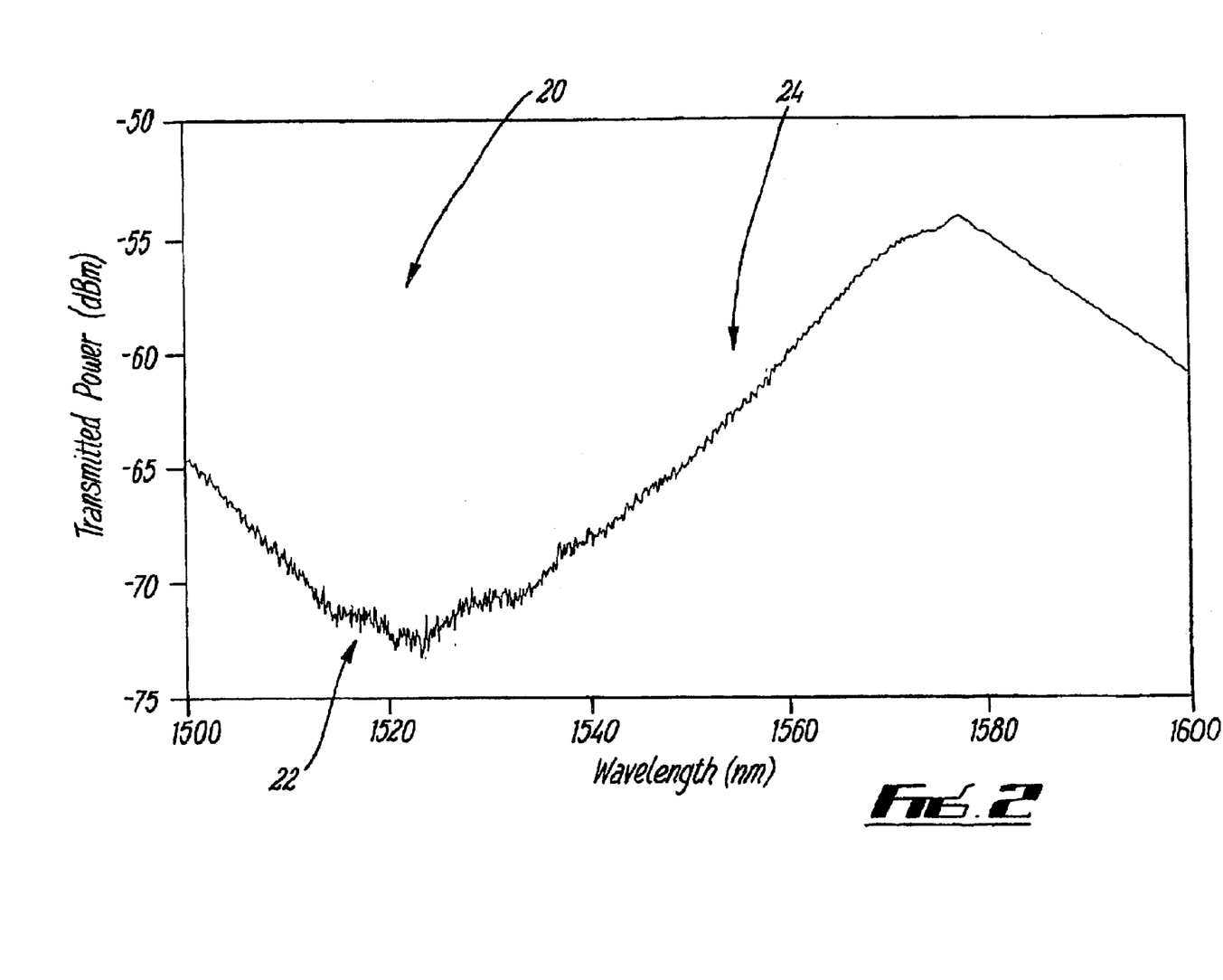
FIG. 2 shows the optical spectrum, in transmission, of a tilted chirped fibre Bragg grating suitable for use in the apparatus of FIG. 1.
Figure 3:
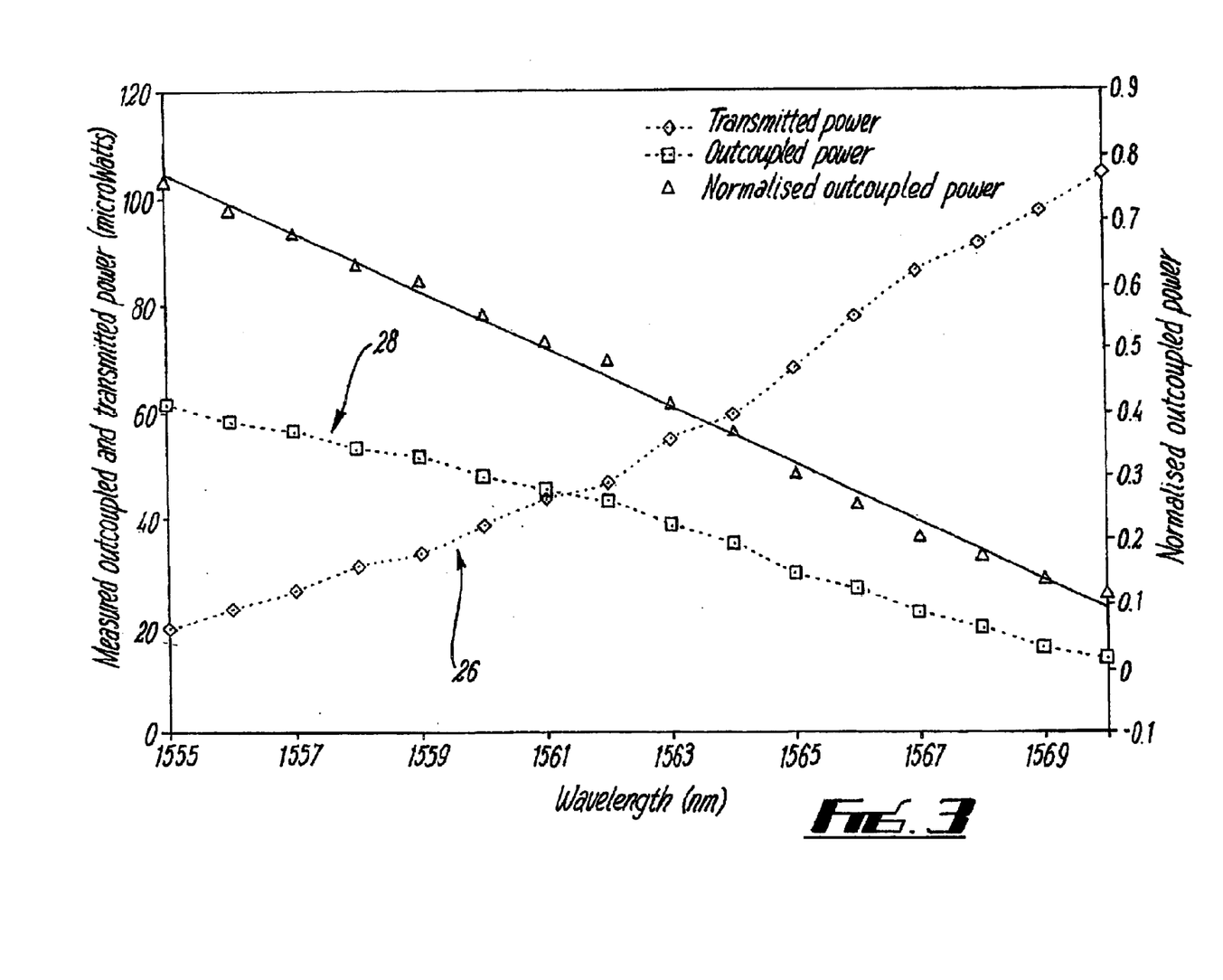
FIG. 3 shows the variation as a function of wavelength of the peak transmitted power and the outcoupled power of a tilted chirped fibre Bragg grating suitable for use in the apparatus of FIG. 1.

Referring to FIGS. 1 to 3, one embodiment of the present invention provides an apparatus 10 for interrogating an optical signal (not shown) propagating in an optical waveguide, which is this example takes the form of an optical fibre. The apparatus 10 has an input section 12 of optical fibre and a second section 14 of fibre through which light entering from the input section 12 will subsequently propagate. The second section 14 includes a grating portion, in the form of a tilted chirped fibre Bragg grating 16 in this example. A tilted chirped fibre Bragg grating is described more fully below. The grating 16 causes at least part of the optical signal to be coupled out of the optical fibre, through the fibre cladding. Optical means, in the form of a photodetector 18 in this example, are provided close to the grating portion of the optical fibre, generally alongside the tilted chirped fibre Bragg grating 16. The photodetector 18 is arranged to collect and detect substantially all of the outcoupled optical signal.

The tilted chirped fibre Bragg grating 16 may be UV inscribed in the optical fibre using the dissimilar wavefronts fabrication technique. This technique is well known in itself to those skilled in the art. During fabrication, the optical fibre is arranged such that the UV interference fringes are tilted with respect to the optical fibre axis, to thereby inscribe grating fringes within the optical fibre which are themselves correspondingly tilted with respect to the fibre axis. Furthermore, the period of the grating fringes increases along the grating 16. This variation in the grating period being known as "chirp". The resulting tilted chirped fibre Bragg grating 16 has a spectral profile in transmission which is typically in the form shown in FIG. 2. The profile 20 has a first region 22 across which the transmitted optical power is substantially constant as a function of wavelength, and a second region 24 across which the transmitted optical power increases as a function of wavelength. In this example, the first region extends from approximately 1510 nm to 1530 nm, and the second region extends generally from 1540 nm to 1570 nm.

These features of the profile 20 are used in various ways, and in various combinations, within the embodiments described herein.

FIG. 3 shows the second region 24 of another suitable grating, with different characteristics, in more detail. As can be seen, the transmitted optical power 26 increases as the wavelength of the optical signal increases, and the power of the outcoupled optical signal 28 consequently decreases. The relationship between the outcoupled optical power 28 and the wavelength of the optical signal within the second section 14 is therefore known, allowing a measurement of the outcoupled optical power to be used to determine the wavelength of the optical signal propagating through the tilted chirped fibre Bragg grating. This is most easily achieved in practice by writing the grating 16 to ensure that the wavelength of the optical signal falls within the wavelength range of the second region 24 of the spectral profile 20 of the grating 16. The nature of the profile 20 in this region 24 simplifies calibration and calculation, and enhances sensitivity.

While this example shows the use of a tilted chirped fibre Bragg grating 16, it will be appreciated that a tilted uniform period fibre Bragg grating may be used in its place.

It will also be appreciated that other optical waveguides may be used in place of the optical fibre described in this example, such as a planar silica waveguide. The in-fibre optical filters described above would then be replaced by equivalent structures fabricated in a planar silica waveguide.

Figure 4:
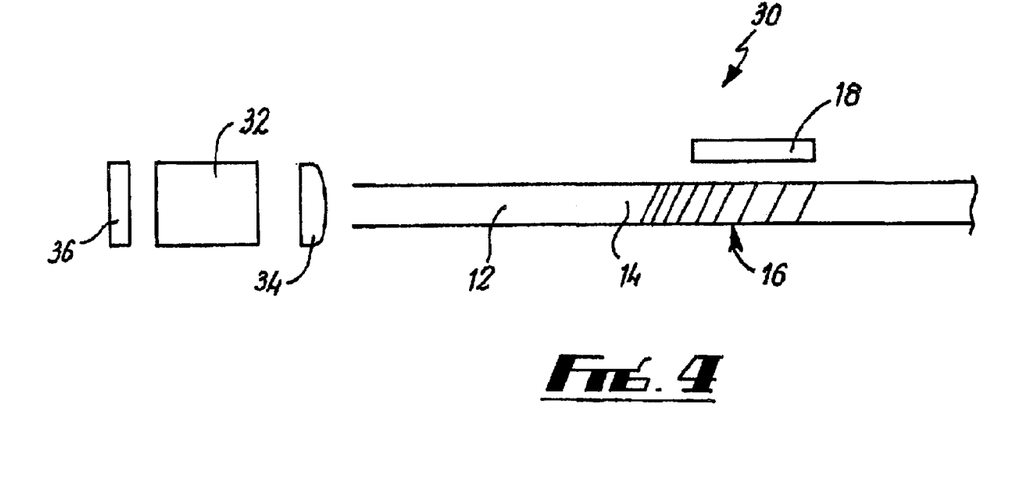
FIG. 4 is a schematic representation of apparatus according to a further aspect of the present invention for determining the wavelength of an optical signal propagating in an optical fibre, including the apparatus of FIG. 1.

A second embodiment of the present invention, shown in FIG. 4, provides apparatus for determining the wavelength of an optical signal (not shown) propagating in an optical waveguide in the form of an optical fibre. The same reference numerals as used above are retained for corresponding features. In this example, the apparatus 30 is used to determine the wavelength of an optical signal originating from a fibre coupled laser in the form of a distributed feedback (DFB) laser 32. The DFB laser 32 is provided in a pigtailed package (not shown in detail if FIG. 4) which includes a lens 34 for launching the output beam from the DFB laser into an input section 12 of fibre.

The apparatus 30 includes means for determining the power of the optical signal in the input section 12, which in this example takes the form of a photodetector 36 located close to the back face of the DFB laser 32. The photodetector 36 is arranged such that a known percentage of the optical power of the laser beam emitted from the back face of the DFB laser 32 is detected by the photodetector 36. The optical power measured by the photodetector 36 may be used to determine the power of the optical signal emitted from the front face of the DFB laser 32 and launched into the input section 12, assuming perfect coupling between the laser 32 and the input section 12. Measurements from the photodetector 36, and coupling to the section 12 may require initial calibration, in practice.

The apparatus 30 further includes apparatus for interrogating the optical signal propagating in the optical fibre, this apparatus being as shown in FIG. 1. In this embodiment the second region 24 of the spectral profile 20 of the tilted chirped fibre Bragg grating 16 is utilised by appropriately writing the grating 16 to ensure that the wavelength of the optical signal emitted by the DFB laser 32 falls within the wavelength range covered by the second region 24 of the spectral profile 20.

During use, part of the optical signal in the fibre 14 will be outcoupled by the grating 16 to the detector 18. Preferably the grating is written so that only weak outcoupling occurs. The known relationship between the wavelength of the optical signal in the fibre 14 and the power of the outcoupled optical signal, such as is shown in FIG. 3, ensures that within the region 24, the wavelength of the optical signal in the fibre 16 is proportional to the ratio of the power of the outcoupled signal ($P_1$), as measured by the photodetector 18, and the power of the optical signal ($P_2$) initially launched, as measured by the photodetector 36. This can be summarised by the following relationship:

$$\lambda \alpha \frac{P_1}{P_2}$$

A third embodiment of the present invention provides apparatus shown in FIG. 5, again for determining the wavelength of an optical signal (not shown) propagating in an optical waveguide in the form of an optical fibre. The apparatus 40 of this embodiment is similar to that shown in FIG. 4, with modifications as set out below. The same reference numerals are therefore retained for corresponding features.

Figure 5:
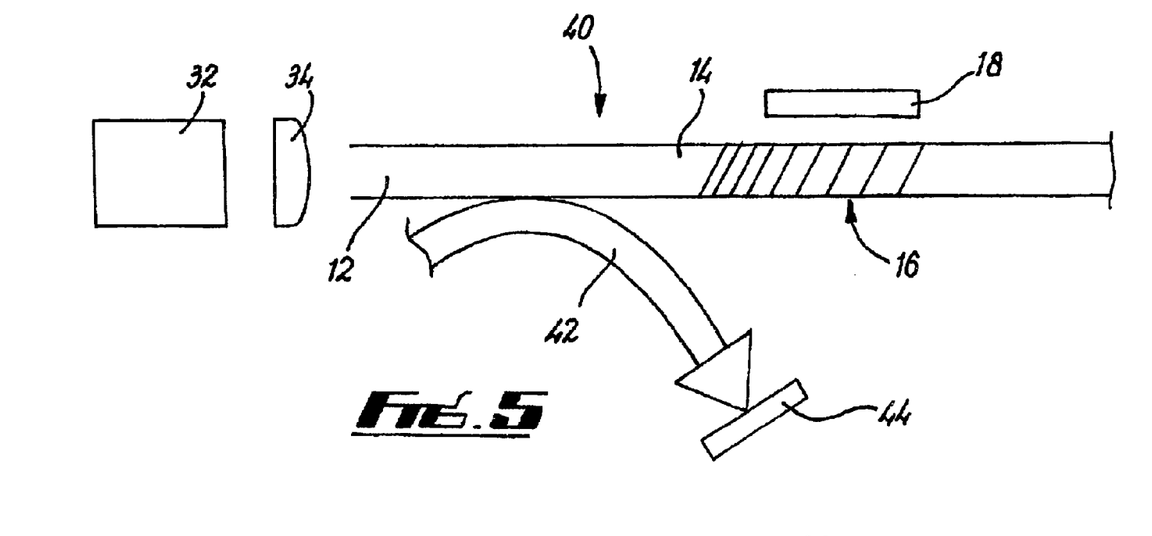
FIG. 5 is a schematic representation of alternative apparatus according to a further aspect of the present invention for determining the wavelength of an optical signal propagating in an optical fibre, including the apparatus of FIG. 1.

In this example, the optical signal in the apparatus 40 originates from a DFB laser 32, but the optical signal may alternatively originate from any fibre coupled laser or a fibre optic system, such as a fibre Bragg grating sensor system.

The means for determining the power of the optical signal includes sampling means, in the form of a tap coupler 42, for tapping a known fraction of the optical signal out of the input section 12 of the fibre. The tap coupler 42 directs the out-tapped signal to an optical detection means, which in this example is a photodetector 44. As will be appreciated, the tap coupler 42 can be fabricated to out-tap any desired fraction of an optical signal, but preferably only a small fraction. In this example the tap coupler 42 out-couples 1% of the optical signal.

Using the tap coupler 42, the total power of the optical signal continuing to propagate along the fibre 14 can be found from the power measured by the tap coupler photodetector 44, taking into account the outcoupling fraction of the tap coupler 42. The wavelength of the signal is again proportional to the ratio of the power ($P_1$) measured by photodetector 18 to the total power (P₂) of the optical signal, as explained above.

Other forms of outcoupler could be used in place of the tap coupler 42, if the outcoupling ratio is known or can be calibrated.

Figure 6:
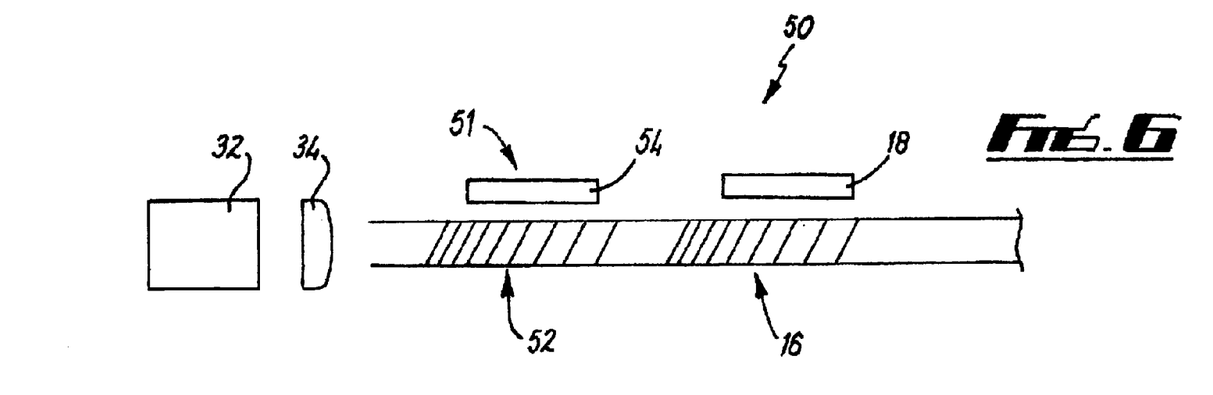
FIG. 6 is a schematic representation of a further alternative apparatus according to a further aspect of the present invention for determining the wavelength of an optical signal propagating in an optical fibre, including the apparatus of FIG. 1.

A fourth embodiment of the present invention is illustrated in FIG. 6. The apparatus 50 of FIG. 6 is again for determining the wavelength of an optical signal propagating in an optical waveguide in the form of an optical fibre. This embodiment is similar to the previous embodiment, shown in FIG. 5, with the modifications set out below. The same reference numerals are accordingly retained for corresponding features.

In this embodiment, tap coupler 42 of FIG. 5 is replaced by sampling means 51 in the form of apparatus for interrogating an optical signal as shown in FIG. 1. The sampling means 51 therefore includes a second tilted chirped fibre Bragg grating 52 and a second photodetector 54, for capturing and detecting an optical signal outcoupled by the second grating 52. The grating 52 is written so that the first region 22 of the spectral profile 20 is utilised at the wavelengths in use.

The spectral profile of the second grating 52 is thus different to the spectral profile 20 of the first grating in that whereas the first grating profile changes significantly with wavelength, in the wavelength range in use, the slope of the second grating profile should be as shallow as possible in the wavelength range in use, so that the power of the outcoupled beam is primarily proportional to the power of the optical signal received from the laser 32. Using the first region 22 for the grating 52 allows a known fraction of the optical signal to be outcoupled to the corresponding photodetector 54. The total power of the optical signal which continues to propagate to the grating 16 can therefore be calculated from the measured outcoupled optical power, as before.

Having deduced the input power to the grating 16, the wavelength of the optical signal can be found, being proportional to the ratio of the power measured by photodetector 18 and the total power of the optical signal as described above in relation to FIGS. 4 and 5.

In the embodiments shown in FIGS. 5 and 6 the sampling means 42,51 are provided before the optical signal reaches the grating 16. The sampling means 42,51 may alternatively be provided, in some situations, after the tilted chirped fibre Bragg grating 16. In this situation, the total power of the optical signal at the grating 16 is the sum of the power derived by measurements at the photodetector 18 and at the photodetector 44,54, multiplied up as before.

Figure 7:
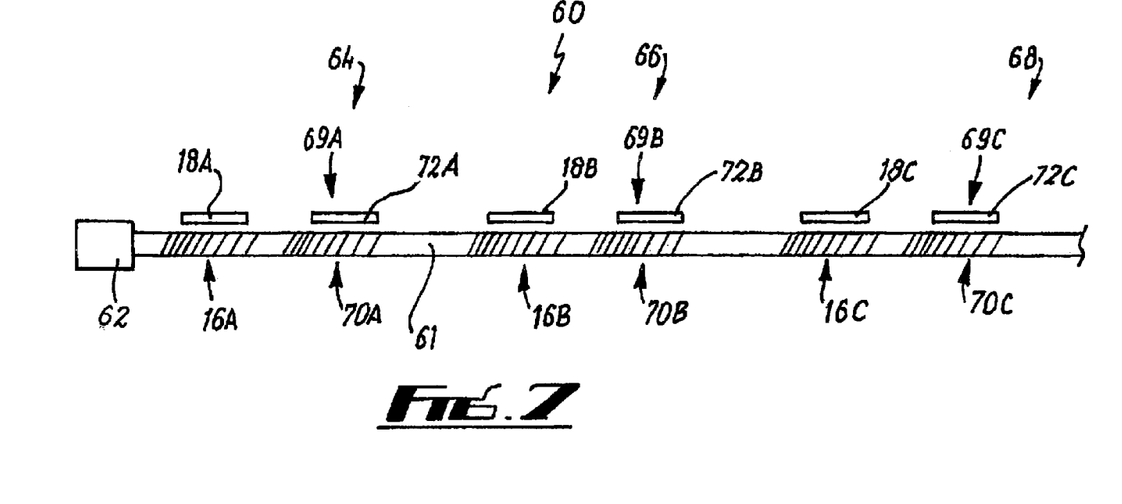
FIG. 7 is a schematic representation of apparatus for determining the wavelength of each of a plurality of optical signals propagating in an optical fibre, comprising a plurality of apparatus as shown in FIG. 6.

In a further embodiment of the invention, as shown in FIG. 7, a plurality of sets of the apparatus shown in FIG. 6 is provided along a length of optical fibre. The same reference numerals are therefore used for corresponding elements, with suffixes A,B,C etc. to distinguish the various sets. This embodiment provides apparatus 60 for determining the wavelength of each of three (in this example) different optical signals propagating within an optical fibre 61. The optical signals originate from an optical system, such as a fibre Bragg grating sensor system, shown schematically at 62.

The optical signals from the system 62 will be located within respective optical channels. The signals are spaced in wavelength space, but the wavelength of each signal may vary within the wavelength range associated with the respective channel. Thus, the precise wavelength of the optical signal in a particular channel, or the presence or absence of a signal within the channel, may be used to convey information.

The apparatus 60 comprises, in this example, three sets 64,66,68 of apparatus for determining the wavelength of an optical signal propagating in an optical fibre, each set 64,66,68 being according to the previous embodiment, as shown in FIG. 6. Each set of apparatus 64,66,68 is operable over a different range of wavelengths, corresponding with a different channel. The sets 64,66,68 of apparatus are arranged in series and in order of increasing wavelength. This arrangement is preferred because fibre grating structures generally interact strongly with optical signals at or below the grating wavelength, but have no effect on signals of wavelengths above the grating wavelength.

Optical signals from the system 62 will first encounter the first set of apparatus 64, which is operable over the shortest wavelengthband, then the second set of apparatus 66, operable over the next shortest wavelengthband, and finally the third set of apparatus 68, which is operable over the longest wavelengthband. Each set of apparatus 64,66,68 covers a wavelength range of several nanometers. The wavelength range is determined by the maximum wavelength change that is expected to be observed in a particular system. The standard channel spacing for many sensing systems is approximately 5 nm.

Thus, the apparatus 64 functions with the lowest wavelength channel, and the apparatus 68 with the highest wavelength channel.

Each set of apparatus 64,66,68 is similar to the apparatus of the previous embodiment, as shown in FIG. 6, with the modifications set out below.

Each set of apparatus 64,66,68 comprises apparatus for interrogating an optical signal, as shown in FIG. 1, followed by sampling means 69, similar to the sampling means 52,54 used in the embodiment shown in FIG. 6. Each sampling means comprises a tilted chirped fibre Bragg grating 70 and a photodetector 72.

The first region 22 of the spectral profile 20 of each tilted chirped fibre Bragg grating 70 is utilised in this embodiment. Each tilted chirped fibre Bragg grating 70 is fabricated to optimise the first region 22 of its spectral profile 20 so that substantially all of an optical signal of a wavelength within the corresponding channel is outcoupled from the optical fibre to the detector 72.

The first tilted chirped fibre Bragg grating 16A in the first set of apparatus 64 outcouples part of the lowest wavelength channel, and the outcoupled signal is detected by the photodetector 18A. The remainder of the lowest channel, and the higher wavelength channels, continue to propagate along the optical fibre until they reach the second tilted chirped fibre Bragg grating 70A in the first set of apparatus 64. The tilted chirped fibre Bragg grating 70A outcouples the rest of the lowest wavelength channel, which is detected by the photodetector 72A. The remaining optical signals, now containing substantially no optical signal in the lowest wavelength channel, continue to propagate along the optical fibre until the second set of apparatus 66 is reached. At the second set of apparatus 66 the next lowest wavelength channel interacts with the tilted chirped fibre Bragg gratings 16B and 70B and is removed from the fibre. Finally, the third and highest wavelength channel interacts with the gratings 16C,70C.

The wavelength of the optical signal in each channel is again proportional to the ratio of the power of the optical signal outcoupled by the corresponding grating 16A,B,C to the total power of the optical signal in that channel. The total power of the optical signal in that channel can be obtained from the sum of the power of the optical signal outcoupled by the two gratings 16,70 for that channel, i.e. the gratings 16A and 70A, or the gratings 16B,70B or the gratings 16C,70C.

It will be readily apparent how the apparatus 60 can be expanded to deal with a greater number of channels, by adding additional sets of apparatus 64,66,68.

It will be appreciated that other optical waveguides, such as a planar silica waveguide, may be used in place of the optical fibre described in the embodiments shown in FIGS. 4 to 7. The sampling means described above would then be replaced by equivalent structures fabricated in a planar silica waveguide. It will also be appreciated that the pigtailed DFB laser 32 shown in FIGS. 4 to 6 would be replaced by a DFB, or other, laser coupled to a planar silica waveguide.

Figure 8A:
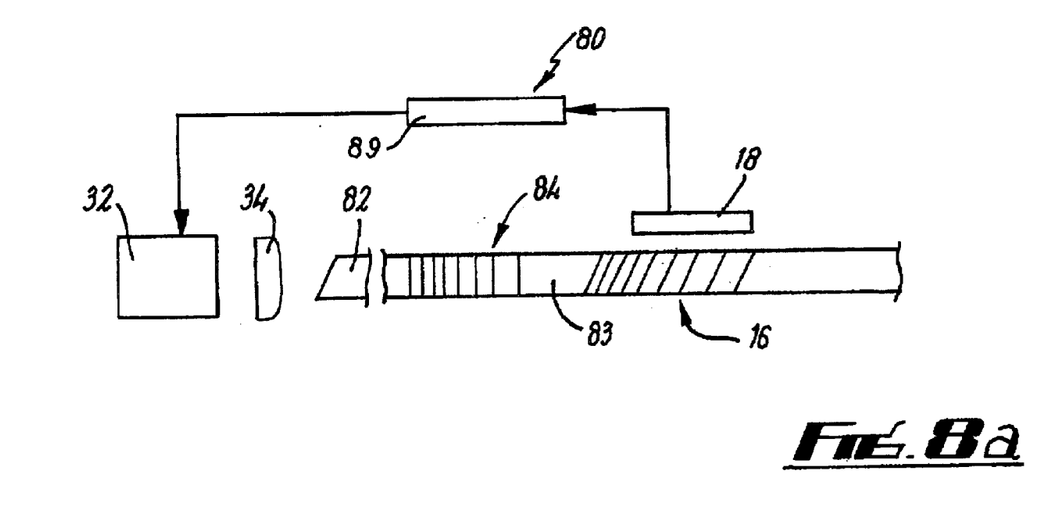
FIG. 8a is a schematic representation of apparatus for stabilising the wavelength of a laser beam emitted by a DFB laser according to a further aspect of the present invention.

A further embodiment of the invention, shown in FIG. 8a, provides apparatus 80 for stabilising the wavelength of a laser beam emitted by, in this example, a DFB laser 32. The apparatus includes an input section 82 of optical fibre, connected to a section 83 of fibre in which there is inscribed an in-fibre bandpass filter 84, in the form of a chirped moiré grating. The chirped moiré grating 84 is followed by apparatus of the type shown in FIG. 1. The first region 22 of the spectral profile 20 of the tilted chirped fibre Bragg grating 16 is utilised in this embodiment. The grating 16 is fabricated so that it is weakly outcoupling and therefore only outcouples a small fraction of the optical signal transmitted to it from the DFB laser 32.

Figure 8B:
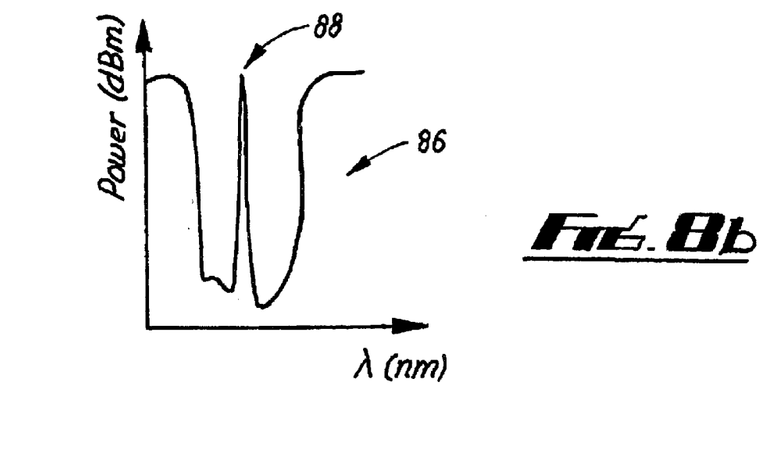

FIG. 8b shows the spectral profile 86 of a chirped moiré grating suitable for use in this embodiment as the grating 84. The chirped moiré grating 84 has a single sharp passband 88 within its spectral profile 86. The grating 84 is written to place the passband 88 at the wavelength to which the laser 32 is to be stabilised.

The output wavelength of the DFB laser 32 may be varied by changing operating parameters such as the temperature of the laser chip, or the voltage or current supplied to the laser chip. When the output wavelength of the DFB laser 32 matches the peak wavelength of the passband 88 of the chirped moiré grating 84, the optical power of the optical signal transmitted by the chirped moiré grating 84 is maximised and causes a corresponding maximum in the power of the outcoupled optical signal detected by the photodetector 18.

An electrical feedback loop 89 is provided between the photodetector 18 and the DFB laser 32. The output from the photodetector 18 is used to control the output wavelength of the DFB laser 32. The feedback loop causes the controller to vary one of the operating parameters in order to tune the wavelength of the output optical signal from the DFB laser 32 to the peak wavelength of the passband 88 of the chirped moiré grating 84. This is detected as maximising the electrical output signal from the photodetector 18, and keeps the laser at the required wavelength.

Figure 9:
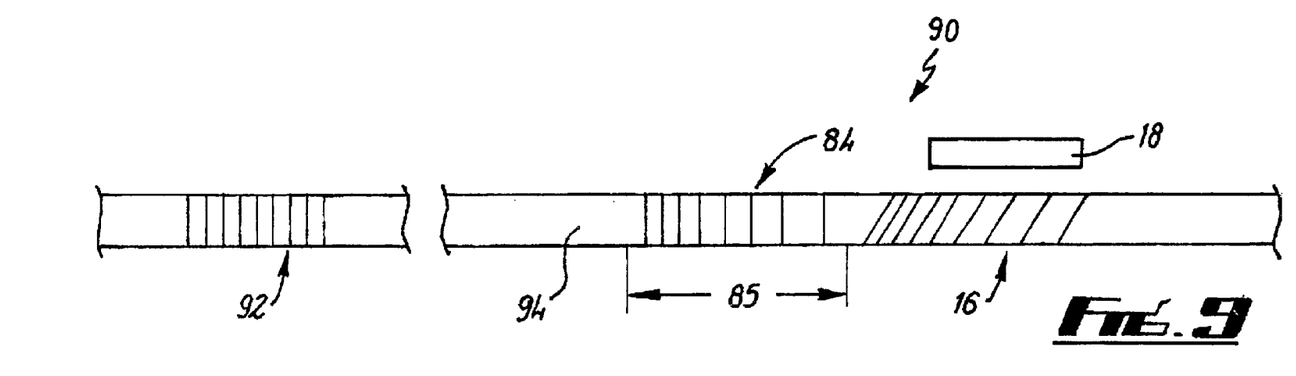
FIG. 9 is a schematic representation of part of an apparatus for determining the value of a parameter applied to an in-fibre sensor by interrogating an optical signal returned by the sensor according to a further aspect of the present invention.

A further embodiment of the invention, shown in FIG. 9, provides apparatus 90 for determining the value of a parameter detected by an in-fibre sensor, in this example a uniform period fibre Bragg grating 92, by interrogating an optical signal returned by the Bragg grating 92. The same reference numerals as used above are retained for corresponding features. The apparatus includes an input section of optical waveguide in the form of a section of optical fibre 94, followed by a waveguide coupled bandpass filter in the form of a section of fibre including a chirped moiré grating 84. The chirped moiré grating 84 is followed by apparatus for interrogating an optical signal propagating in an optical waveguide, as shown in FIG. 1, the waveguide taking the form of an optical fibre. The first region 22 of the spectral profile 20 of the tilted chirped fibre Bragg grating 16 is utilised.

The chirped moiré grating 84 is mounted on a tuning apparatus 85 (shown schematically) operable to apply a variable parameter, in this case axial strain, to the chirped moiré grating 84, to thereby tune the peak wavelength of the passband 88 of the chirped moiré grating 84.

It will be appreciated that the peak wavelength of the passband of the grating 84 may be tuned through the application of a different parameter to the grating 84. In particular, the grating 84 may be temperature tuned.

In this example, the parameter applied to the fibre Bragg grating sensor 92 is axial strain, but it will be appreciated that other parameters, such as axial compression, temperature and pressure may alternatively be sensed. The peak wavelength of the fibre Bragg grating 92 changes in response to the axial strain applied to the grating, and thus the wavelength of an optical signal reflected by the fibre Bragg grating 92 will also change.

Similarly to the previous embodiment, shown in FIG. 8a, when the peak wavelength of the passband 88 of the chirped moiré grating 84 matches the wavelength of the optical signal reflected from the fibre Bragg grating 92, the power of the optical signal outcoupled by the tilted chirped fibre Bragg grating 16 detected by the photodetector 18 is maximised.

In operation, the peak wavelength of the passband 88 of the chirped moiré grating 84 is tuned by applying a variable axial strain to the chirped moiré grating 84 until a maximum power outcoupled optical signal is detected by the photodetector 18. The value of the strain applied to the chirped moiré grating 84 can then be used to calculate the peak wavelength of the passband 88 of the grating 84, using the well known relationship between axial strain and grating wavelength, and hence the wavelength of the optical signal reflected from the sensor grating 92. In practice, calibration may be required in order to take account of any fibre slippage which may occur during application of the axial strain to the grating 84. Once the wavelength of the optical signal reflected by the fibre Bragg grating 92 is known, the strain or other parameter being measured by the sensor can be determined by using the known relationship, or calibration data.

It will be appreciated that the value of many parameters applied to the fibre Bragg grating 92 can be calculated in a similar way, assuming that the relationship between the wavelength of the fibre Bragg grating and the applied parameter is known, or has been previously calibrated.

Figure 10:
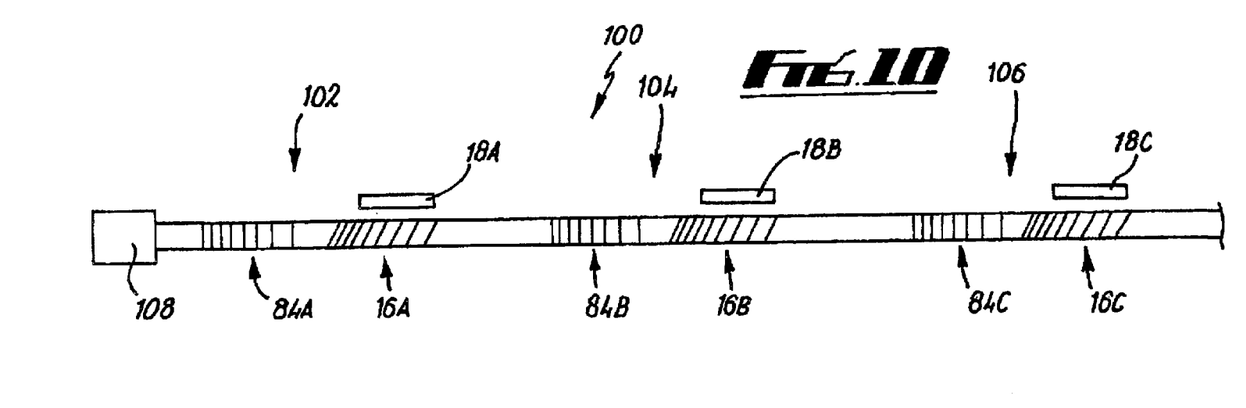
FIG. 10 is a schematic representation of apparatus for determining the value of a plurality of parameters applied to a corresponding one of a plurality of in-fibre sensors, comprising a plurality of apparatus as shown in FIG. 9.

In a further embodiment of the present invention, shown in FIG. 10, a plurality of apparatus for determining the value of a parameter measured by an in-fibre sensor, as shown in FIG. 9, are provided along a length of optical fibre, to form a system 100 for determining the value of a parameter applied to each of a plurality of in-fibre sensors. In this example, three sets of apparatus 102,104,106 are provided along a length of optical fibre. Each set of apparatus 102, 104,106 comprises a chirped moiré grating 84, a tilted chirped fibre Bragg grating 16 and a photodetector 18.

Each of the sets 102,104,106 of apparatus are operable to interrogate the optical signal returned from a respective one of three fibre Bragg gratings within an optical sensing system, shown generally at 108. Each of the fibre Bragg gratings within the optical sensing system 108 has a different peak wavelength, and the peak wavelength of each fibre Bragg grating is tuneable over a predetermined wavelength range. The wavelength tuning range of each Bragg grating is isolated from the tuning range of each other Bragg grating in wavelength space. Each set of apparatus 102,104,106 is operable over a different wavelength range, each wavelength range corresponding to the tuning range of the respective fibre Bragg grating sensor.

The first set of apparatus 102 is operable over the lowest wavelength range, and therefore interrogates the lowest wavelength fibre Bragg grating within the sensor system 108, but in the manner described above in relation to FIG. 9. The sets of apparatus 102,104,106 are arranged in the direction of propagation of the or each optical signal, in the direction left to right across the page of the figure, in series in order of increasing wavelength. The first set of apparatus 102 is operable over the shortest wavelength range, the second set of apparatus 104 is operable over a range of longer wavelengths, and so on.

Although only three sets of apparatus 102,104,106 are shown in this example, it will be appreciated that a large number of sets of apparatus may be provided, one for each fibre Bragg grating sensor provided within the optical sensor system 108.

It will be appreciated that other optical waveguides, such as a planar silica waveguide, may be used in place of the optical fibre described in relation to the embodiments shown in FIGS. 8 to 10.

Figure 11:
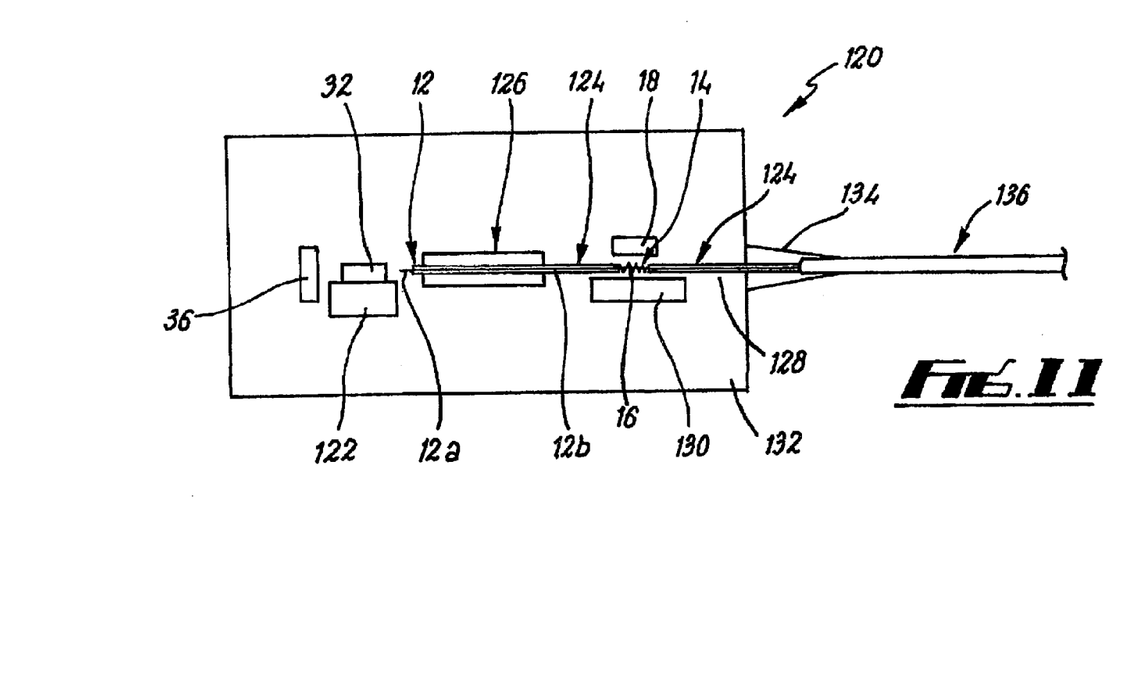
FIG. 11 is a schematic representation of a pigtailed package for use with apparatus similar to FIGS. 4 or 6.

A further embodiment of the invention, shown in FIG. 11, provides a pigtailed laser diode package 120 incorporating apparatus similar to that shown in FIG. 4 The same reference numerals as used above are retained for corresponding features.

The apparatus 120 comprises a DFB laser 32 mounted on a peltier device 122 operable to control the temperature of the laser 32. Means for determining the power of the optical signal in the input section of optical fibre 12 are provided in the form of a photodetector 36 located close to the backface of the DFB laser 32.

The input section of fibre 12 comprises a first part 12a from which the outer coating has been removed and a second part 12b along which the outer coating has been replaced by a metalised coating 124. The end of the first part 12a of the input section of fibre is cleaved and aligned with the front face of the laser chip 32. A lens may additionally be provided between the laser 32 and the fibre 12, as shown in FIG. 4, to improve the optical coupling therebetween.

A section of the second part 12b of the input section of fibre is mounted within a keyed ferrule 126. The second part 12b of the input section of fibre is soldered into position with the ferrule 126, the solder acting between the metalised coating 124 and the ferrule keying.

The metalised coating 124 extends along the optical fibre to the second section of fibre 14 which includes the tilted chirped fibre Bragg grating 16. No coating is provided on the second section 14 of the optical fibre. The tilted chirped fibre Bragg grating 16 is mounted on a second peltier device 130 operable to control the temperature of the grating 16. The peltier device 130 may alternatively be replaced by a mounting block provided with a thermistor device operable to measure the temperature of the grating 16. Knowledge of the exact temperature of the grating 16 enables the wavelength of the grating 16 to be known accurately. The grating 14 may be athermalised so that a change in the ambient temperature will not affect the wavelength of the grating 14.

A third section of fibre 128 extends from the output end of the second section 14 of the fibre. This section of fibre 128 is also provided with a metalised coating 124. The third section 128 of the optical fibre extends outside the housing 132 through a connector 134 to an output section 136 of optical fibre which has its coating intact.

Optical means in the form of a photodetector 18 are provided close to the grating portion of the optical fibre, generally alongside the tilted chirped fibre Bragg grating 16, to collect and detect the outcoupled optical signal as described above. The orientation of the grating 14 is sufficiently controlled by the key on the ferrule 126 so that substantially all of the outcoupled light is collected by the detector 18.

The pigtailed package 120 also includes a housing 132 within which the above mentioned components are mounted.

The apparatus shown in FIG. 6 may be similarly provided within a pigtailed package, the photodetector 36 being replaced by a second tilted chirped fibre Bragg grating and a second photodetector.

The present invention therefore provides apparatus for interrogating an optical signal propagating in an optical waveguide which has many applications, including the specific embodiments described above. The apparatus has the advantage that it can be fibre optic based, and is therefore fully compatible with fibre optic systems. The apparatus can be spliced directly onto the fibre optic system to be interrogated, thereby greatly reducing the optical loss associated with transferring the optical signal to be interrogated from its originating optical system into the apparatus. The apparatus can also be planar silica waveguide based, and is therefore fully compatible with planar silica waveguide systems, often refereed to as integrated optics. The apparatus therefore provides a much lower loss interrogating system than known bulk optic measuring devices. The apparatus is also substantially less expensive and much more compact than existing bulk optic devices.

Various modifications may be made without departing from the scope of the present invention. For example, focusing optics may be provided between the tilted chirped fibre Bragg gratings and the photodetectors. This would allow use of a photodetector having a photosensitive area substantially less than the area covered by the light beam outcoupled by the grating portion. Other conventional coupling arrangements could be used to ensure minimal light losses. These are not shown in the drawings (which are schematic) in the interests of clarity. It will be appreciated that the tilted chirped fibre Bragg grating spectral profile shown in FIG. 2 is merely an example, and that the tilted chirped fibre Bragg grating or tilted uniform period Bragg gratings may be fabricated with a differently shaped spectral profile, at wavelengths different to those shown.

In the above embodiments, the use of a DFB laser is described, but it will be appreciated that any suitable fibre coupled laser may be interrogated using the apparatus of the embodiments. In particular, the apparatus described in FIG. 8a may be used with any pigtailed semiconductor laser device. The embodiments shown in FIG. 5 are described in relation to a DFB laser source, but it will be appreciated that the optical signal to be interrogated may also originate from a separate fibre optic system, such as a fibre Bragg grating based sensor system.

The chirped moiré gratings used in the embodiments shown in FIGS. 8a, 9 and 10 may be replaced by any other suitable in-fibre bandpass filter, such as a uniform period moiré grating, or a chirped fibre Bragg grating having a passband provided within its spectral profile. It will also be appreciated that the spectral profile of a chirped moiré grating shown in FIG. 8b is merely an example, and a moiré grating having a spectral profile of a different bandwidth or a different width passband may be used, as required by the particular application.

As discussed, it will be appreciated that the embodiments described in FIGS. 9 and 10 may be used to determine the value of a wide range of parameters other than axial strain. It will also be appreciated that each in-fibre sensor may be subject to a different parameter.

It will also be appreciated that where the optical waveguide is a planar silica waveguide, or other planar waveguide, the various in-fibre gratings and the tap coupler will be replace by equivalent planar waveguide structures.

While use of a tilted chirped fibre Bragg grating is specifically referred to in the embodiments described, it will be appreciated that a tilted uniform period fibre Bragg grating may be used instead.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

What is claimed is:

1. Apparatus for interrogating an optical signal propagating in an optical waveguide, the apparatus comprising:
    an optical waveguide having a grating portion along which the refractive index of the waveguide vanes periodically,
    the said variation giving the grating portion a spectral profile having a first region across which the transmitted optical power is substantially constant as a function of wavelength and a second region across which the transmitted optical power changes as a function of wavelength,
    the said variation of refractive index causing at least part of the optical signal to be coupled out of the grating portion of the waveguide,
    wherein when said optical signal is of a wavelength falling within said second region the optical power of said outcoupled optical signal changes as a function of said wavelength,
    and first optical means operable to measure the optical power of an outcoupled optical signal, from which the wavelength of said optical signal having a wavelength falling within said second region can be determined.

2. Apparatus according to claim 1 in which each of the first and second wavelength ranges are broader than the spectral bandwidth of the optical signal to be interrogated.

3. Apparatus according to claim 1 in which the first wavelength range covers shorter wavelengths than the second wavelength range.

4. Apparatus according to claim 1 in which the first and second wavelength ranges are substantially adjacent in wavelength space.

5. Apparatus according to claim 1 in which the optical waveguide is an optical fibre.

6. Apparatus according to claim 5 in which the grating portion is a tilted fibre Bragg grating.

7. Apparatus according to claim 6 in which the grating portion is a tilted chirped fibre Bragg grating.

8. Apparatus according to claim 6 in which the grating portion is a tilted uniform period fibre Bragg grating.

9. Apparatus according to claim 1 in which the optical waveguide comprises a planar optical waveguide.

10. Apparatus according to claim 1 in which the first optical means comprises photodetector means.

11. Apparatus according to claim 10 in which the photosensitive area of the photodetector means is at least as great as the area covered by the outcoupled light.

12. Apparatus according to claim 10 in which the first optical means further comprises coupling means such as focusing optics provided within the path of the outcoupled light, to couple substantially all of the outcoupled light to the photodetector means.

13. Apparatus for determining the wavelength of an optical signal propagating in an optical waveguide, the apparatus comprising:
    apparatus for interrogating an optical signal propagating in an optical waveguide, the apparatus being according to claim 1 and utilising the second region of the spectral profile of the grating portion to cause at least part of the optical signal to be coupled out,
    and means for determining the total power of the optical signal to be interrogated, the wavelength of the said optical signal being proportional to the ratio of the power of the outcoupled optical signal to the total power of the optical signal.

14. Apparatus according to claim 13 in which the optical waveguide is an optical fibre.

15. Apparatus according to claim 13 in which the grating portion comprises a tilted fibre Brags grating.

16. Apparatus according to claim 15 in which the grating portion is a tilted chirped fibre Bragg grating.

17. Apparatus according to claim 15 in which the grating portion is a tilted uniform period fibre Bragg grating.

18. Apparatus according to claim 14 in which the optical fibre waveguide is optically coupled to a fibre coupled laser operable to generate an optical signal.

19. Apparatus according to claim 18 in which the fibre coupled laser is a distributed feedback (DFB) laser provided within a pigtailed package.

20. Apparatus according to claim 18 in which the means for determining the total power of optical signal comprises optical detection means.

21. Apparatus according to claim 20 in which the optical detection means comprises a photodetector.

22. Apparatus according to claim 21 in which the photodetector means is located close to the back face of the DFB laser such that the whole of the laser beam emitted from the back face of the DFB laser is incident on the photosensitive area of the photodetector means, to thereby determine the total power of the optical signal.

23. Apparatus according to claim 14 in which the optical fibre waveguide is optically coupled to a fibre optic system operable to generate an optical signal.

24. Apparatus according to claim 23 in which the fibre optic system is a fibre Bragg grating sensor system.

25. Apparatus according to claim 23 in which the means for determining the total power of the optical signal comprises sampling means for tapping at least a known fraction of the optical signal our of the input section of fibre and directing the said signal fraction to an optical detection means.

26. Apparatus according to claim 25 in which the optical detection means is a photodetector.

27. Apparatus according to claim 25 in which the sampling means is a tap coupler.

28. Apparatus according to claim 25 in which the sampling means comprises apparatus according to claim 1, utilising the first region of the spectral profile of the grating portion to cause part of the optical signal to be coupled out.

29. Apparatus according claim 23 in which the grating portion is a tilted fibre Bragg grating.

30. Apparatus according to claim 29 in which the grating portion is a tilted chirped fibre Bragg grating.

31. Apparatus according to claim 29 in which the grating portion is a tilted uniform period fibre Bragg grating.

32. Apparatus according to claim 13 in which the means for determining the total power of the optical signal is encountered by the optical signal before the apparatus for interrogating the optical signal.

33. Apparatus according to claim 13 in which the means for determining the total power of the optical signal is encountered by the optical signal after the apparatus for interrogating the optical signal.

34. Apparatus according to claim 14 in which a plurality of apparatus for determining the wavelength of an optical signal propagating in an optical fibre are provided along a length of optical fibre.

35. Apparatus according to claim 34 in which each of the said plurality of apparatus is operable to determine the wavelength of an optical signal within a particular range of wavelengths, each wavelength range being different.

36. Apparatus according to claim 35 in which the said plurality of apparatus are provided along the length of optical fibre in series in order of increasing wavelength.

37. Apparatus according to claim 35 in which the sampling means of each apparatus taps substantially the whole of the optical signal within the respective wavelength range out of the fibre.

38. Apparatus according to claim 35 in which each optical signal originates from a respective fibre Bragg grating sensor within a sensor system.

39. Apparatus according to claim 13 in which the optical waveguide comprises a planar optical waveguide.

40. Apparatus for stabilising the wavelength of a laser beam emitted by an optical waveguide coupled laser, the apparatus comprising:
an optical waveguide coupled bandpass filter,
apparatus for interrogating an optical signal propagating through the filter, the apparatus being in accordance with claim 1 and the apparatus utilising the first region of the spectral profile of the grating portion to cause at least part of the optical signal to be coupled out,
there being feedback tuning means operable to maintain the output wavelength of the laser at the peak wavelength of the passband of the bandpass filter.

41. Apparatus according to claim 40 in which the optical waveguide is an optical fibre.

42. Apparatus according to claim 41 in which the grating portion is a tilted fibre Bragg grating.

43. Apparatus according to claim 42 in which the grating portion is a tilted chirped fibre Bragg grating.

44. Apparatus according to claim 42 in which the grating portion is a tilted uniform period fibre Bragg grating.

45. Apparatus according to claim 41 in which the optical waveguide coupled laser is a semiconductor laser provided within a pigtailed package.

46. Apparatus according to claim 45 in which the laser is a pigtailed DFB laser.

47. Apparatus according to claim 46 in which the wavelength and power of the DFB laser output signal is controllable by a controller means.

48. Apparatus according claim 41 in which the optical waveguide coupled bandpass filter is an in-fibre bandpass filter.

49. Apparatus according to claim 48 in which the in-fibre bandpass filter is an in-fibre moiré grating.

50. Apparatus according to claim 47 in which the in-fibre bandpass filter is an in-fibre chirped Moiré grating.

51. Apparatus according to claim 46 in which the feedback tuning means comprises a feedback loop responsive to the output signal from the photodetector means to control the DFB laser.

52. Apparatus according to claim 51 in which the feedback tuning means is operable to tune the laser output signal wavelength to the peak wavelength of the passband of the bandpass filter.

53. Apparatus according to claim 40 in which the optical waveguide comprises a planar optical waveguide.

54. Apparatus for determining the value of a first parameter sensed by an in-fibre sensor, by interrogating an optical signal returned by the sensor, the apparatus comprising:
an optical waveguide coupled bandpass filter,
tuning means operable to apply a variable second parameter to the bandpass filter, to thereby tune the peak wavelength of the passband of the bandpass filter to match the wavelength of the optical signal,
and apparatus for interrogating an optical signal transmitted by the filter, the apparatus being in accordance with claim 1 and utilising the first region of the spectral profile of the grating portion to cause at least part of the optical signal to be coupled out,
the apparatus being operable to measure the power of the optical signal transmitted by the bandpass filter,
whereby to detect a wavelength match between the optical signal wavelength and the peak wavelength of the passband, to allow the value of the first parameter to be determined by calculation from the value of the second parameter applied to the bandpass filter.

55. Apparatus according to claim 54 in which the optical waveguide is an optical fibre.

56. Apparatus according to claim 54 in which the grating portion is a tilted fibre Bragg grating.

57. Apparatus according to claim 56 in which the grating portion is a tilted chirped fibre Bragg grating.

58. Apparatus according to claim 56 in which the grating portion is a tilted uniform period fibre Bragg grating.

59. Apparatus according to claim 55 in which the waveguide coupled bandpass filter is an in-fibre bandpass filter.

60. Apparatus according to claim 59 in which the in-fibre bandpass filter is an in-fibre Moiré grating.

61. Apparatus according to claim 58 in which the in-fibre bandpass filter is an in-fibre chirped Moiré grating.

62. Apparatus according to claim 55 in which the tuning means is operable to apply a variable axial force to the bandpass filter.

63. Apparatus according to claim 62 in which the tuning means is operable to apply a variable axial strain to the bandpass filter.

64. Apparatus according to claim 54 in which the tuning means is operable to apply a variable temperature to the bandpass filter.

65. Apparatus according to claim 55 in which the in-fibre sensor is an in-fibre Bragg grating sensor.

66. Apparatus according to claim 65 in which the first parameter, applied to the Bragg grating sensor, is axial strain.

67. Apparatus according to claim 65 in which the first parameter, applied to the Bragg grating sensor, is temperature.

68. Apparatus according to claim 65 in which a plurality of in-fibre Bragg grating sensors are provided, each sensor sensing the value of a parameter applied to it.

69. Apparatus according to claim 68 in which the peak wavelength of each sensor Bragg grating falls within the same wavelength range.

70. Apparatus according to claim 69 in which the apparatus further comprises time division multiplexing means operable to demultiplex the optical signals returned by the sensor Bragg gratings.

71. Apparatus according to claim 55 in which a plurality of apparatus for determining the value of a parameter sensed by an in-fibre sensor are provided along a length of optical fibre.

72. Apparatus according to claim 71 in which each of the said plurality of apparatus is operable to determine the value of a parameter applied to a corresponding one of a plurality of sensor fibre Bragg gratings, the peak wavelength of each sensor Bragg grating falling within a different wavelength range.

73. Apparatus according to claim 71 in which the said plurality of apparatus are provided along the length of optical fibre in series, in order of increasing wavelength.

* * * * *